United States Patent
Saito

(10) Patent No.: US 6,990,005 B2
(45) Date of Patent: Jan. 24, 2006

(54) SEMICONDUCTOR DEVICE

(75) Inventor: Hitoshi Saito, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 10/802,809

(22) Filed: Mar. 18, 2004

(65) Prior Publication Data
US 2004/0184307 A1 Sep. 23, 2004

(30) Foreign Application Priority Data
Mar. 20, 2003 (JP) .............................. 2003-078395

(51) Int. Cl.
*G11C 11/22* (2006.01)
(52) U.S. Cl. ........................ 365/145; 365/63; 365/149
(58) Field of Classification Search ................ 365/149, 365/63, 145
See application file for complete search history.

(56) References Cited

U.S. PATENT DOCUMENTS 5,898,608 A * 4/1999 Hirano et al. ............... 365/145
6,777,736 B2 * 8/2004 Saigoh et al. ............... 257/300
6,781,862 B2 * 8/2004 Takahashi et al. .......... 365/145

FOREIGN PATENT DOCUMENTS

JP 8-321186 12/1996
JP 9-120700 5/1997

* cited by examiner

*Primary Examiner*—Son T. Dinh
(74) *Attorney, Agent, or Firm*—Westerman, Hattori, Daniels & Adrian, LLP

(57) ABSTRACT

The present invention relates to a ferroelectric non-volatile memory. The configuration of the memory includes: a plurality of ferroelectric capacitors for memory in which each one end is connected to each of a plurality of first bit lines via switching transistor; first plate lines connected to the other ends of the ferroelectric capacitors for memory; first ferroelectric capacitors for reference in which each one end thereof is connected to a second bit line via first n-channel MOS transistor; a second plate line connected to the other ends of the first ferroelectric capacitors for reference; and a p-channel MOS transistor connected to the second plate line.

10 Claims, 13 Drawing Sheets

"1" WRITING

"1" READOUT

"0" WRITING

"0" READOUT

SEMICONDUCTOR DEVICE

CROSS-REFERENCE TO RELATED APPLICATIONS

This application is based upon and claims priority of Japanese Patent Application No. 2003-078395, filed on Mar. 20, 2003, the contents being incorporated herein by reference.

BACKGROUND OF THE INVENTION

1. Field of the Invention

The present invention relates to a semiconductor device having ferroelectric capacitors in a memory cell.

2. Description of the Prior Art

There is known a ferroelectric non-volatile memory called a FeRAM (Ferroelectric Random Access Memory), for example, as a non-volatile memory capable of storing information even if a power source is turned off.

The ferroelectric non-volatile memory has ferroelectric capacitors where the relation between a polarization charge and an applied voltage is in hysteresis characteristics, and has a structure that it stores data of "1" or "0" by using polarization and inversion thereof in the ferroelectric capacitor. Such a ferroelectric non-volatile memory can be operated in high-speed and low power consumption, and its future development is expected.

Various types are suggested as a storage method of the ferroelectric non-volatile memory, and there exist a 1T1C type that stores 1-bit by using one each of transistor and capacitor and a 2T2C type that stores 1-bit by using two each of transistor and capacitor. In the 1T1C type, the number of elements is made smaller to reduce a cell area comparing to the 2T2C type. Further, the following patent document 1 describes a structure that a control circuit switches the 1T1C type and the 2T2C type and the cell area is regurated by the 2T2C type.

The ferroelectric non-volatile memory of 1T1C type, as described in the following patent document 2, requires a ferroelectric capacitor for reference (hereinafter, referred to as reference capacitor) to output a reference value for reading out data in order to determine the data of "0" or "1", other than ferroelectric capacitors for memory (hereinafter, referred to as memory capacitor).

Next, the basics of the 1C1T type memory cell will be described based on FIGS. 1 and 2.

In FIG. 1, one ends of first and second bit lines 101a, 101b are connected to a column decoder 102 and the other ends are connected to a sense amplifier 103. Further, in a memory cell region, a plurality of word lines 104a for memory and plate lines 105a for memory are alternately formed in a direction orthogonal to the first and second bit lines 101a, 101b. The word lines for memory cell 104a are connected to a row decoder 106, and the plate lines 105a for memory cell are connected to a plate driver 107.

A memory capacitor 109a is connected between the first bit line 101a and each plate line 105a for memory via source/drains of a first n-channel MOS transistor 108a. Further, a word line 104a for memory cell is connected to the gate electrode of the first n-channel MOS transistor 108a.

Furthermore, a plate line 105b for reference is connected to the plate driver 107, and a word line 104b for reference is connected to the row decoder 106. Then, a reference capacitor 109b is connected between the plate line 105b for reference and a second bit line 101b via source/drains of a second n-channel MOS transistor 108b. The gate electrode of the second n-channel MOS transistor 108b is connected to the word line 104b for reference.

In such a ferroelectric non-volatile memory, the column decoder 102 applies selected voltage to the first and second bit lines 101a, 101b, the row decoder 106 applies selected voltage to the first and second word lines 104a, 104b, and the plate driver 107 applies selected voltage to the plate line 105a for memory cell and the plate line 105b for reference.

Then, when reading out data, the sense amplifier 103 compares the potential variation of the first bit line 101a and the potential variation of the second bit line 101b, and data is detected according to a size of the difference between the two potential variations.

Next, a readout operation of data stored in the ferroelectric non-volatile memory will be described. Herein, data "0" is always stored in the reference capacitor 109b in a state other than writing and reading-out of data, and the polarization charge of the reference capacitor 109b is +$Q_2$ at point C of a hysteresis line I shown in FIG. 2.

In a state where data "1" is written in the memory capacitor 109a, the polarization charge of the reference capacitor 109b is -$Q_1$ at point A of a hysteresis line II shown in FIG. 2. Further, in a state where data "0" is written in the memory capacitor 109a, the polarization charge of the reference capacitor 109b is +$Q_1$ at point B of the hysteresis line II shown in FIG. 2.

Then, in the case of reading out the data of the memory capacitor 109a, the voltage of the first and second word lines 104a, 104b and the first and second plate lines 105a, 105b are made to vary in the timing shown in FIG. 3, and the voltage of the first and second bit lines 101a, 101b also vary accordingly.

First, after a signal voltage that the row decoder 106 applies to the first and second word lines 104a, 104b has risen from 0 to Vcc, a signal voltage that the plate diver 107 applies to the first and second plate lines 105a, 105b rises from 0 to Vcc. Note that 0 and Vcc are ground voltage and a power source voltage, respectively, and their units are in volt. Thus, voltage $V_1$ is applied to the memory capacitor 109a and its polarization state moves along a hysteresis loop II shown in FIG. 2 to finally reach point D and the polarization charge becomes +$Q_{01}$. Note that the voltage $V_1$ applied to the memory capacitor 109a is lower than Vcc due to voltage drop.

Herein, the polarization direction of the memory capacitor 109a is inverted when the data of the memory capacitor 109a is "1". In contrast, the polarization direction of the memory capacitor 109a is not inverted when the data is "0". At the same time, the polarization state of the reference capacitor 109b moves along a hysteresis loop I shown in FIG. 2 to finally vary from point C to point E and the polarization charge becomes $Q_{02}$, where the polarization direction is not inverted.

Therefore, in the memory capacitor 109a, the transfer quantity of the polarization charge is $\alpha = +Q_{01} - (-Q_1)$ when data "1" is written in the memory capacitor 109a, and the transfer quantity of the polarization charge is $\beta = +Q_{01} - (Q_1)$ when data "0" is written.

On the other hand, the transfer quantity of the polarization charge is $\gamma = +Q_{02} - Q_2$ in the reference capacitor 109b.

The potential of the bit lines 101a, 101b increases according to the transfer quantities $\alpha$, $\beta$, $\gamma$ of the polarization charge, and the sense amplifier 103 amplifies the increased quantity. Then, the amplifier compares the charge variation quantities of the first bit line 101a and the second bit line 101b based on the transfer quantities $\alpha$, $\beta$, $\gamma$ of the polarization charge, and reads out either "1" or "0" stored in the memory capacitor 109a. Specifically, when the variation value of the potential of the first bit line 101a is larger than the variation value of the potential of the second bit line 101b ($\alpha>\beta$), the amplifier holds as a fact that "1" is stored in the memory capacitor 109a. On the other hand, when the variation value of the first bit line is smaller ($\gamma>\beta$), the amplifier holds as a fact that "0" is stored in the memory capacitor 109a.

Consequently, in order to accurately read out the memory capacitor 109a, the transfer quantity $\gamma$ of the polarization charge of the reference capacitor 109b shown in FIG. 2 needs to be set to a size between the inversion transfer quantity a and the non-inversion transfer quantity $\beta$ of the polarization charge.

(Patent Document 1)
Japanese Patent Laid-open No.Hei9-120700 publication (paragraph no.0011 to 0016)

(Patent Document 2)
Japanese Patent Laid-open No.Hei8-321186 publication (paragraph no.0057 to 0063, FIG. 9)

Meanwhile, it is often the case that data such as an identification number for each chip is written in the ferroelectric non-volatile memory by customer's request before heat treatment such as resin capsulation and solder junction (hereinafter, referred to as mounting/IR heat treatment).

However, the polarization charge quantity $Q_2$ at point C of the hysteresis loop of the reference capacitor 109b readily depolarizes widely at the temperature of 200° to 250° C.

In the depolarized reference capacitor 109b, a residual polarization charge quantity varies to point C' on a polarization charge quantity axis of FIG. 2, and the transfer quantity of the polarization charge during data readout increases to $\gamma'$ ($\gamma'>\alpha>\beta$). As a result, data readout of the memory capacitor 109a based on the residual polarization quantity of the reference capacitor 109b cannot be performed.

Although the residual polarization quantity varied by the heat of the reference capacitor 109b returns to point C when the temperature is brought back to an original one and rewrite is performed, writing prior to heat treatment is meaningless.

Note that the memory capacitor 109a could also be depolarized by heat, but its depolarization quantity is not as large as that of the reference capacitor 109b because many memory capacitors 109a are connected to the bit line 101a.

SUMMARY OF THE INVENTION

It is an object of the present invention to provide a semiconductor device capable of suppressing the occurrence of readout error of data written prior to heat treatment.

According to one aspect of the present invention, there is provided a semiconductor device comprising: a plurality of ferroelectric capacitors for memory (memory capacitors) in which each one end thereof is connected to each of a plurality of first bit lines via switching transistor; first plate lines connected to the other ends of the ferroelectric capacitors for memory (memory capacitors); first ferroelectric capacitors for reference (reference capacitors) in which each one end thereof is connected to a second bit line via first n-channel MOS transistor; a second plate line connected to the other ends of the first ferroelectric capacitors for reference (reference capacitors); and a p-channel MOS transistor connected to the second plate line.

According to another aspect of the present invention, there is provided a semiconductor device comprising: a memory cell region of 2T2C type, which stores 1-bit by first and second transistors and first and second ferroelectric capacitors for memory (memory capacitors); and a memory cell region of 1T1C type, which stores 1-bit by a third transistor and a third ferroelectric capacitor for memory (memory capacitors).

According to the present invention, in a ferroelectric non-volatile memory of 1T1C type, the n-channel MOS transistor is used as a transistor connected between a reference capacitor and a bit line, and the p-channel MOS transistor is used as a transistor connected to a plate line connecting to the reference capacitor.

Herein, when reading out reference data written in the reference capacitor, negative voltage with respect to the bit line is applied to the reference capacitor via the p-channel MOS transistor and the plate line. Note that the reference data is composed of the polarization charge, which is plus for the bit line side of reference capacitor and minus for the plate line side thereof.

As described, when the p-channel MOS transistor is adopted as a transistor that applies voltage to the plate line of the reference capacitor, accumulated charge written in the reference capacitor becomes hard to be depolarized.

Further, according to another aspect of the present invention, the memory cell region of 2T2C type and the memory cell region of 1T1C type are allowed to coexist, and the memory cell of 2T2C type is selected to write data before mounting/IR heat treatment.

Since the memory cell of 2T2C type does not require a reference capacitor, readout error of data caused by heat treatment is hard to occur even if the data is written before the heat treatment. Furthermore, since the memory cell of 1T1C type also coexists, the area of the entire memory cell region can be reduced comparing to a ferroelectric non-volatile memory composed of only the memory cell of 2T2C type.

DESCRIPTION OF THE PREFERRED EMBODIMENT

Embodiments of the present invention will be explained with reference to the drawings hereinafter.

First Embodiment

Figure 4:
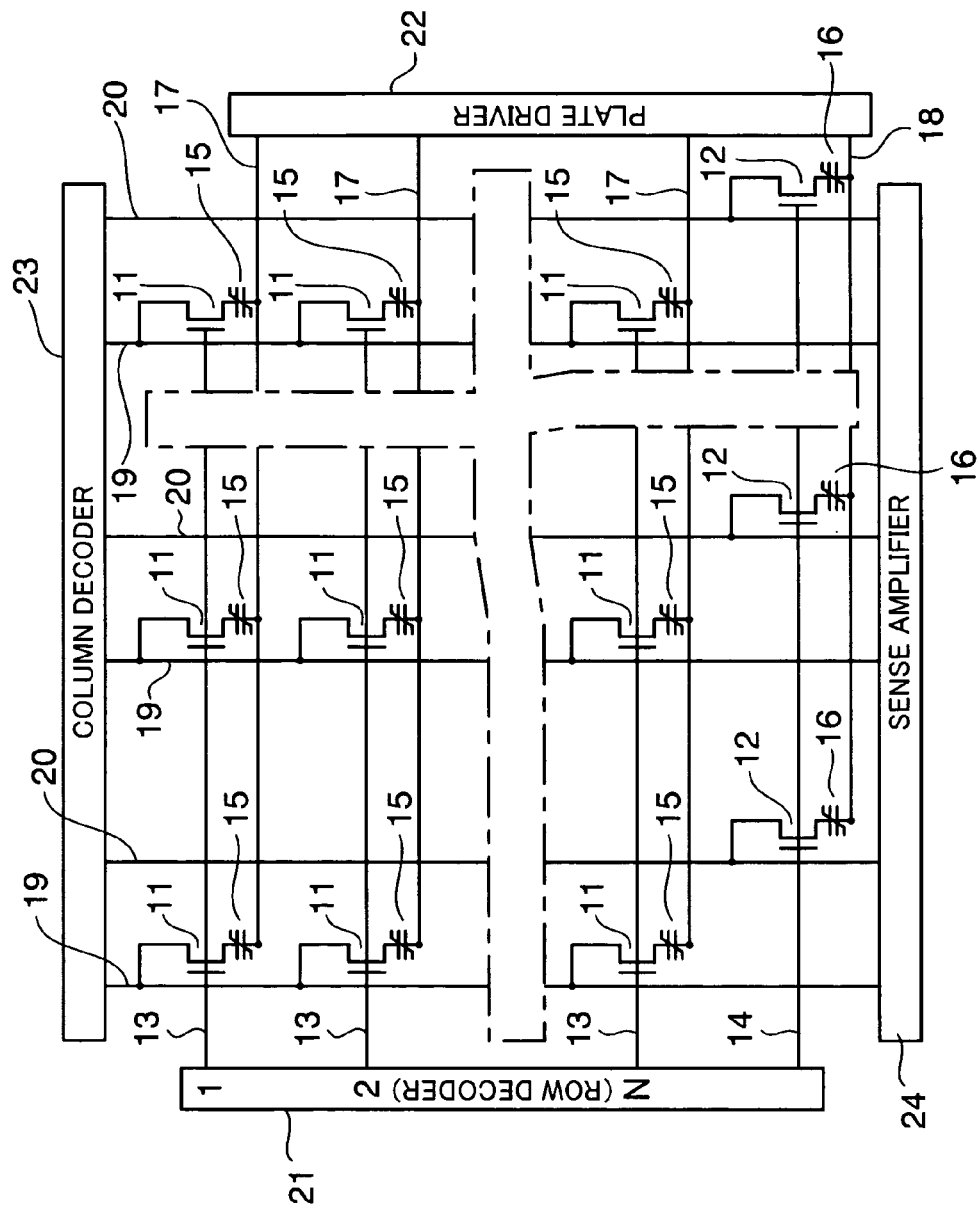
FIG. 4 is a circuit diagram of a ferroelectric non-volatile memory according to a first embodiment of the present invention.
Figure 5:
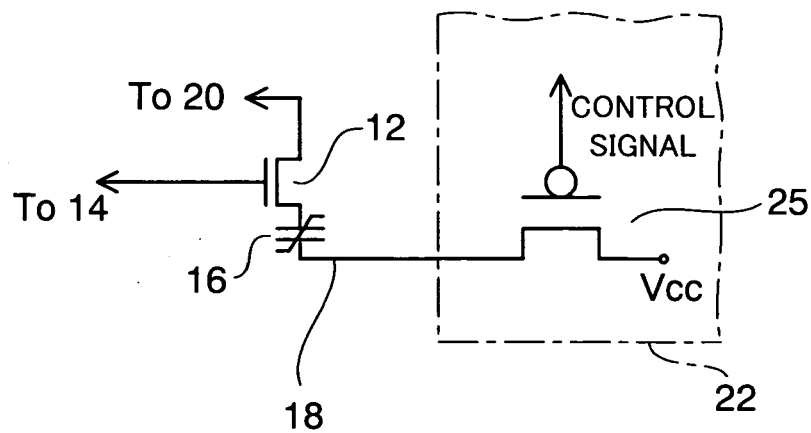
FIG. 5 is a circuit diagram showing a reference cell of the ferroelectric non-volatile memory according to the first embodiment of the present invention.
Figure 6:
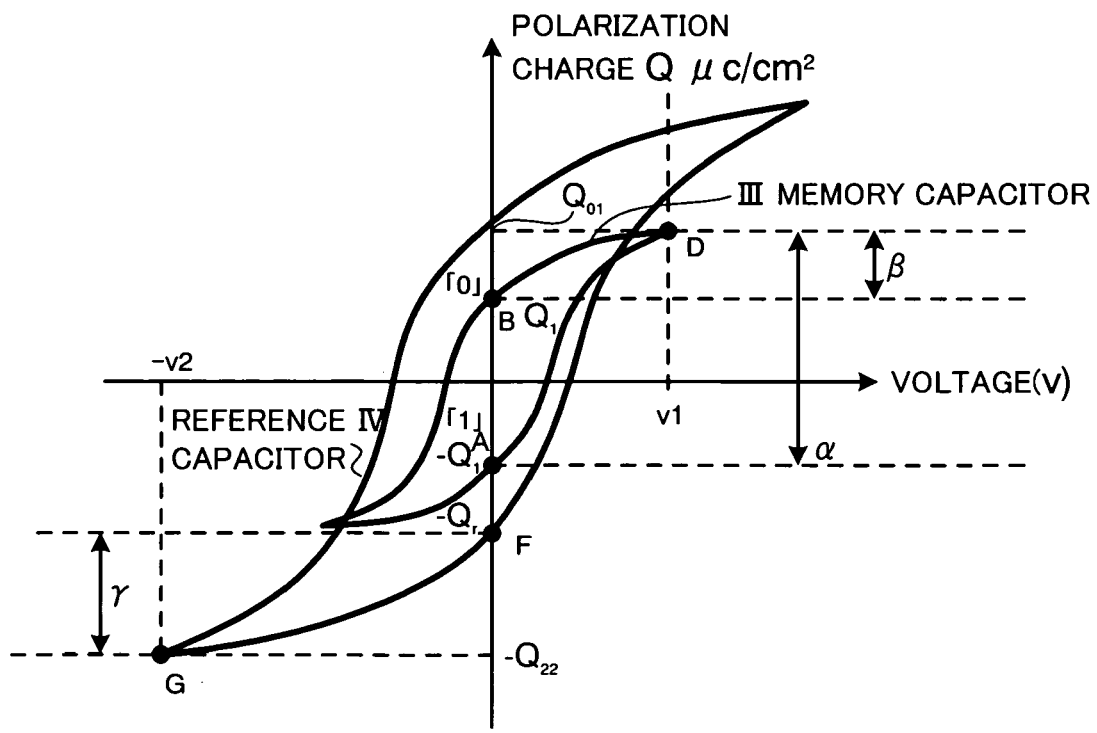
FIG. 6 is a view showing the relation between voltage and polarization charge quantity of a memory capacitor and a reference capacitor of the ferroelectric non-volatile memory according to the first embodiment of the present invention.

FIG. 4 is the circuit diagram of the ferroelectric non-volatile memory according to the first embodiment of the present invention, FIG. 5 is the circuit diagram of the reference cell of the ferroelectric non-volatile memory, and FIG. 6 is the view showing the relation between the voltage and the polarization charge quantity of the memory capacitor and the reference capacitor of the ferroelectric non-volatile memory.

In FIG. 4, a plurality of first n-channel MOS transistors 11 are formed on a silicon substrate (not shown) vertically and horizontally at an interval. The first n-channel MOS transistors 11 arranged one by one in a horizontal direction are in one row, and the first n-channel MOS transistors 11 arranged one by one in a vertical direction are in one column. Further, a plurality of second n-channel MOS transistors 12 are formed in a line on the silicon substrate in the horizontal direction at an interval from the first n-channel MOS transistors 11 of the last row.

Furthermore, a plurality of word lines 13 for memory, which connect the gate electrodes of the first n-channel MOS transistors 11 by each row, are formed at an interval on an element isolation insulating film (not shown) formed on the surface of the silicon substrate to partition the first and second n-channel MOS transistors 11, 12.

Moreover, a word line for reference 14, which connects the gate electrodes of the second n-channel MOS transistors 12 arranged in the horizontal direction by plural numbers, is formed on the element isolation insulating film.

On a first insulating film (not shown) covering the first and second n-channel MOS transistors 11, 12, memory capacitors (ferroelectric capacitor for memory) 15 are formed near each of a plurality of the first n-channel MOS transistors (switching transistor) 11, and furthermore, reference capacitors (ferroelectric capacitor for reference) 16 are formed near each of a plurality of the second n-channel MOS transistors (switching transistor) 12.

As the memory capacitor 15, a ferroelectric capacitor having a structure that a first electrode and a second electrode sandwich a ferroelectric film that is a PZT film, for example. Similarly, as the reference capacitor 16, a ferroelectric capacitor having the ferroelectric film sandwiched by the first and second electrodes is used.

Further, the memory capacitors 15 and the reference capacitors 16 are covered with a second insulating film (not shown). Bit lines 19 for memory and bit lines 20 for reference, which intersect with the first and second word lines 13, 14 in a lattice shape, are formed above the second insulating film. The bit lines for memory cell 19 and the bit lines 20 for reference 20 are formed in plural numbers alternately in the horizontal direction at an interval.

One node of source/drains of the respective first n-channel MOS transistors 11 arranged in plurality numbers on each column is connected to the bit line 19 for memory cell. Thus, a plurality of the first n-channel MOS transistors 11 arranged on each row are connected to different bit lines 19 for memory.

Further, the first electrode of the memory capacitor 15 is connected to each of the other nodes of source/drains of the respective first n-channel MOS transistors 11. The second electrodes of a plurality of the memory capacitors 15 in the same row are connected to a same plate line 17 for memory. Thus, a plurality of memory capacitors 15 arranged in the vertical direction are connected to different plate lines 17 for memory.

One node of source/drains of the respective second n-channel MOS transistors 12 arranged in plural numbers in the horizontal direction on the last row is connected to different bit lines 20 for reference. Further, each of the other node of source/drains of the respective second n-channel MOS transistors 12 arranged in plural numbers in a line in the horizontal direction is connected to the first electrode of the reference capacitor 16. Still further, the second electrodes of a plurality of the reference capacitors 16 arranged in the horizontal direction are connected to one plate line 18 for reference.

The plate lines 17, 18 have a structure that they serves as the second electrodes of the memory capacitors 15 and the reference capacitors 16, or a structure that they are formed above an insulating film covering the memory capacitors 15 and the reference capacitors 16.

With the above-described configuration, one each of the first n-channel MOS transistor 11 and the memory capacitor 15 is arranged in each intersection region of N-lines (N:integer) of the word lines 13 for memory and M-lines (M:integer) of the bit lines 19 for memory. Further, one each of the second n-channel MOS transistor 12 and the reference capacitor 16 is arranged in each intersection region of the word lines 14 for reference and the bit lines 20 for reference.

The word lines 13 for memory and the word line 14 for reference are connected to a row decoder 21, and the plate lines 17 for memory and the plate lines 18 for reference are connected to a plate driver 22. Moreover, one ends of the bit lines for memory 19 and the bit lines for reference 20 are connected to a column decoder 23, and the other ends are connected to a sense amplifier 24.

Note that elements such as the n-channel MOS transistors 11, the capacitors for memory 15, the word lines (13, 14), the bit lines (19, 20) and plate lines (17, 18) in different layers are connected to each other by direct connection or connection via holes or conductive plugs.

Meanwhile, as shown in FIG. 5, a p-channel MOS transistor 25 is formed as a switching element in the plate driver 22 to control voltage of the plate line 18 for reference. Consequently, the reference capacitor 16 is connected to the n-channel MOS transistor 12 on bit line 20 side and is connected to the p-channel MOS transistor 25 on the plate line 18 side, and voltage of 0 or −Vcc is applied to the reference capacitor 16 via the p-channel MOS transistor 25.

The p-channel MOS transistor 25 is formed on an n-well of the silicon substrate and the n-channel MOS transistor 12 is formed on a p-well of the silicon substrate. In this case, it is necessary to make the interval between the n-well and the p-well as large as approximately 10 μm in order to secure the break-down voltage between p-well and n-well. Note that the interval between the p-wells is approximately 1 μm generally.

The relation between the polarization charge and voltage of the reference capacitor 16 comes to a hysteresis loop IV as shown in FIG. 6. Then, the reference capacitor 16 is set to a state where data "1" is always written instead of "0" in the prior art. Specifically, the residual polarization quantity in the state where no voltage is applied to the reference capacitor 16 is the size of $-Q_r$ at point F on the polarization charge axis.

The relation between the polarization charge and voltage of the memory capacitor 15 comes to a hysteresis loop III shown in FIG. 6, which is the same as the prior art.

Figure 7:
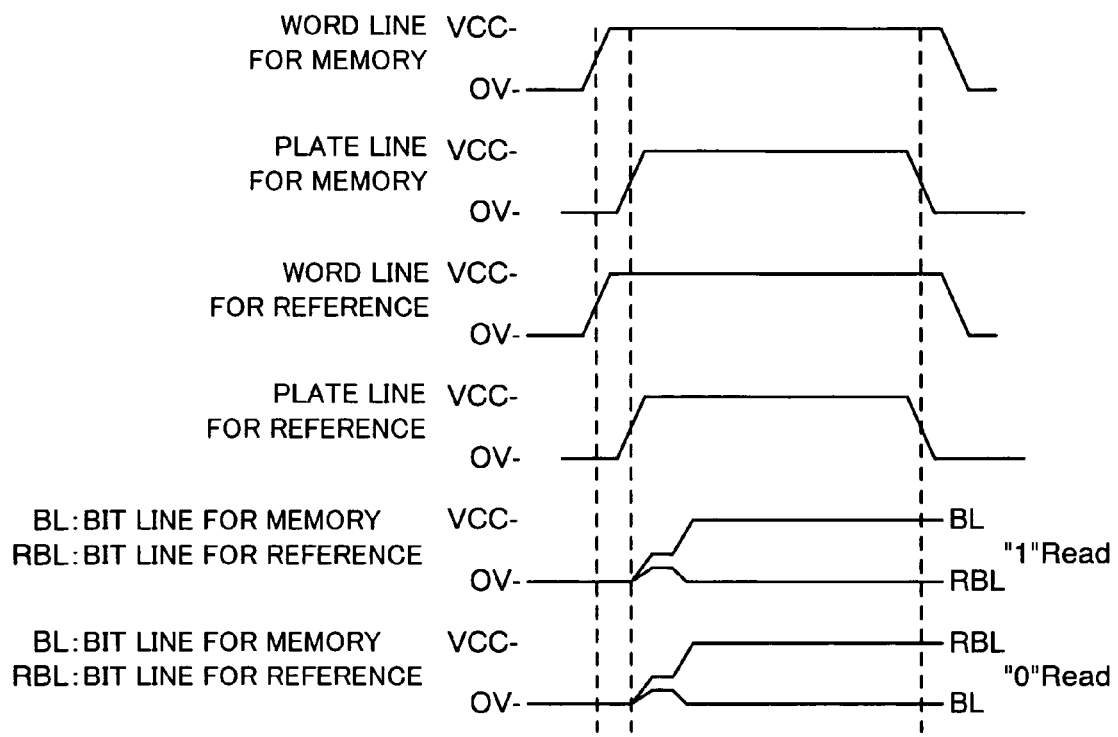
FIG. 7 is a timing chart of word lines, bit lines, and plate lines of the ferroelectric non-volatile memory according to the first embodiment of the present invention.

Then, when reading out data of memory capacitor 15, each voltage of the word lines 13 for memory, the word lines 14 for reference, the plate lines 17 for memory, and plate lines 18 for reference is controlled in the timing shown in FIG. 7. Accordingly, the voltage of the bit lines for memory 19 and the bit lines for reference 20 varies based on the data of the memory capacitor 15. The voltage is controlled by the plate driver 22 and the row decoder 21.

First, after a signal voltage that the row decoder 21 applies to the word lines 13 for memory and the word lines 14 for reference has risen from 0 to Vcc, a signal voltage that the plate diver 22 applies to the plate lines 17 for memory and the plate lines 18 for reference rises from 0 to Vcc. Note that 0 and Vcc are a fixed potential such as the ground potential and the power source voltage, respectively, and their units are in volt.

Thus, voltage $V_1$ is applied to the memory capacitor 15, the polarization charge of the memory capacitor 15 moves along the hysteresis loop III shown in FIG. 6 to finally reach point D, and the polarization charge quantity becomes $+Q_{01}$.

Herein, although the polarization direction of the memory capacitor 15 moves from point A and is inverted when the data of the memory capacitor 15 is "1", the polarization direction of the memory capacitor 15 moves from point B and is not inverted when the data of the memory capacitors 15 is "0". At the same time, voltage $-V_2$ is applied to the reference capacitor 16, the polarization charge moves along the hysteresis loop IV to finally vary from point F to point G, and the polarization charge quantity varies from $-Q_r$ to $-Q_{22}$, where the polarization direction is not inverted.

Therefore, when data "1" is written in the memory capacitor 15, the transfer quantity of the polarization charge is $\alpha=+Q_{01}-(-Q_1)$, and the transfer quantity of the polarization charge is $\beta=+Q_{01}-(-Q_1)$ when data "0" is written therein.

On the other hand, the transfer quantity of the polarization charge is $\gamma=-Q_{22}-(-Q_r)$ in the reference capacitor 16. Herein, each condition of the accumulated charges is adjusted to hold the relation of $\alpha<\gamma<\beta$.

The potential of the bit lines 19, 20 increases corresponding to the transfer quantity of the polarization charge $(\alpha,\beta,\gamma)$, and the increased quantity is amplified the sense amplifier 24. Then, the sense amplifier compares the potential variation of the bit lines for memory 19 and the bit lines for reference 20, and reads out the fact that either "1" or "0" stored on the memory capacitor 15. Specifically, when the variation value of the potential of the bit lines for memory 19 is larger than the variation value of the potential of the bit lines for reference 20 ($\alpha>\gamma$), the amplifier reads the fact that "1" is stored in the memory capacitor 15. On the other hand, when the variation value of the bit lines for memory is smaller ($\gamma>\beta$), the amplifier reads the fact that "0" is stored in the memory capacitor 15. Therefore, in order to accurately read out the memory capacitor 15, the transfer quantity γ of the polarization charge of the reference capacitor 16 shown in FIG. 6 is set to a size between the inversion transfer quantity α and the non-inversion transfer quantity β of the polarization charge of the memory capacitor 15.

Figure 8A:
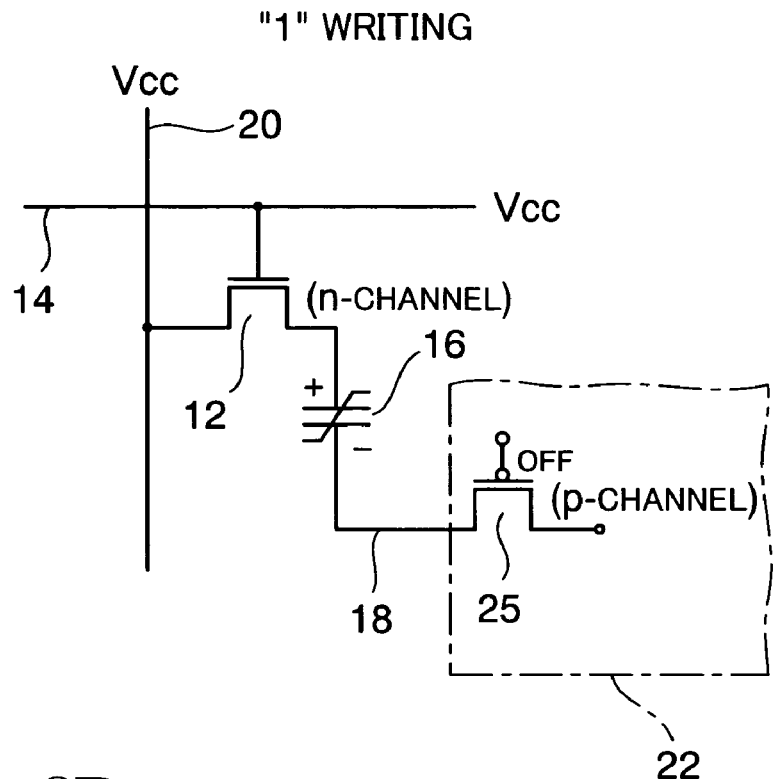
FIGS. 8A and 8B are operational exemplary views of the reference capacitor of the ferroelectric non-volatile memory according to the first embodiment of the present invention.

To write "1" in the reference capacitor 16, the potential of the word line 14 for reference and the potential of the bit line 20 for reference are severally set to Vcc as shown in FIG. 8A, and the p-channel MOS transistor 25 is turned OFF. It leads to setting The potential of the plate line 18 for reference to 0.

Thus, in the reference capacitor 16, the first electrode for the n-channel MOS transistor 12 side becomes positive charge and the second electrode for the p-channel MOS transistor 25 side becomes negative charge. As a result, voltage $-V_2$ is applied to the reference capacitor 16 and the polarization charge quantity of the reference capacitor 16 becomes $-Q_{22}$. When the voltage of the word line 14 and the bit line 20 is returned to 0 thereafter, the residual polarization charge quantity of the reference capacitor 16 becomes $-Q_r$.

Figure 8B:
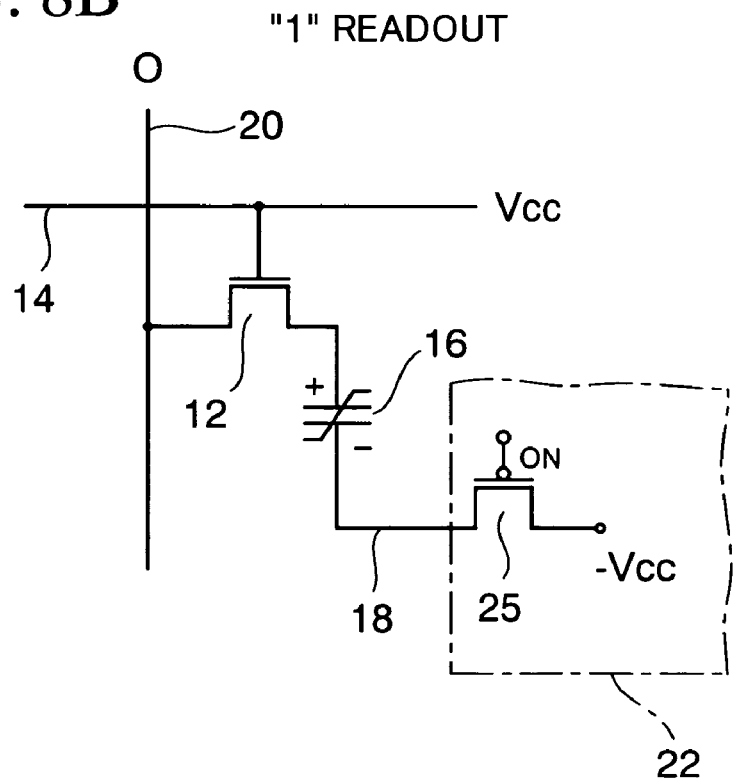

Further, in reading out data, the voltage applied to the bit line 20 for reference is set to 0, the voltage applied to the word line 14 for reference is set to Vcc, and the p-channel MOS transistor 25 is turned ON. It leads to making the voltage applied to the plate line for reference 18 be −Vcc, as shown in FIG. 8B. Thus, in the reference capacitor 16, the first electrode for the n-channel MOS transistor 12 side becomes positive charge and the second electrode for the p-channel MOS transistor 25 side becomes negative charge. With this, the polarization charge quantity moves from $-Q_r$ to $-Q_{22}$ by γ.

When heat of 230° C. is applied for 1 minute, for example, to the semiconductor chip on which the ferroelectric non-volatile memory is formed in order to perform resin capsulation, the same heat is applied to the reference capacitor 16 having the residual polarization charge quantity $-Q_{22}$.

In this case, the positive charges of the first electrode of the reference capacitor 16 are hard to pass through the n-channel MOS transistor 12, and additionally, the negative charges of the second electrode are hard to pass through the p-channel MOS transistor 25. Consequently, the reference capacitor 16 is hard to be depolarized due to the heat.

Meanwhile, all transistors connected to the second plate lines 18 connecting to the reference capacitors 16 do not necessarily need to be the p-channel MOS transistor 25, and the n-channel MOS transistor may be used in the memory region where the data is written after the mounting/IR heat treatment.

Figure 9A:
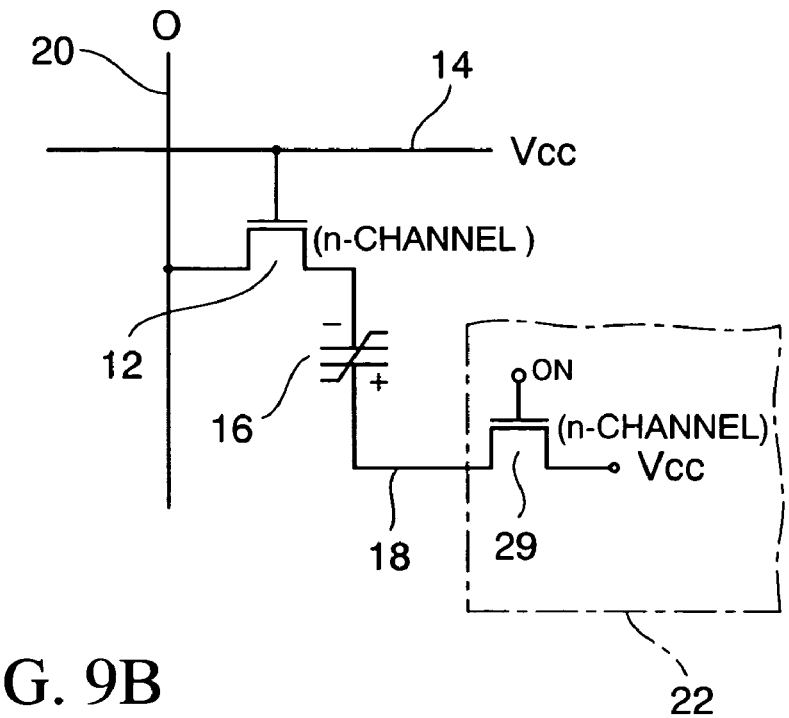
FIGS. 9A and 9B are operational exemplary views of a reference capacitor of the conventional ferroelectric non-volatile memory.

For example, as a switching element in the plate driver 22 which is connected to the reference capacitor 16 of the memory region where the data is written after the mounting/IR heat treatment, an n-channel MOS transistor 29 is used as shown in FIG. 9A.

Next, the write and readout operations of the reference capacitor 16 shown in FIG. 9A will be described.

Figure 1:
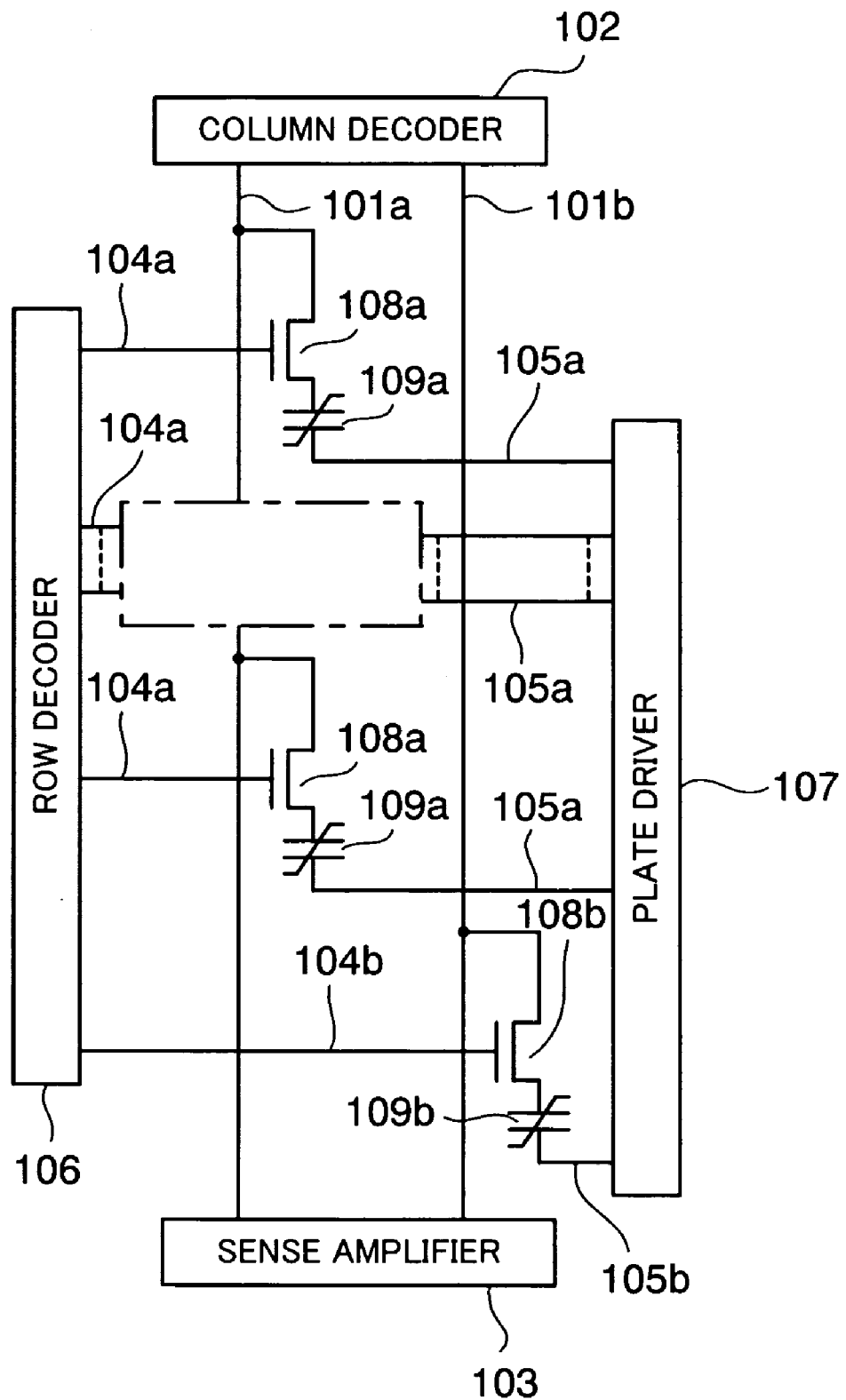
FIG. 1 is a circuit diagram of a conventional ferroelectric non-volatile memory.
Figure 2:
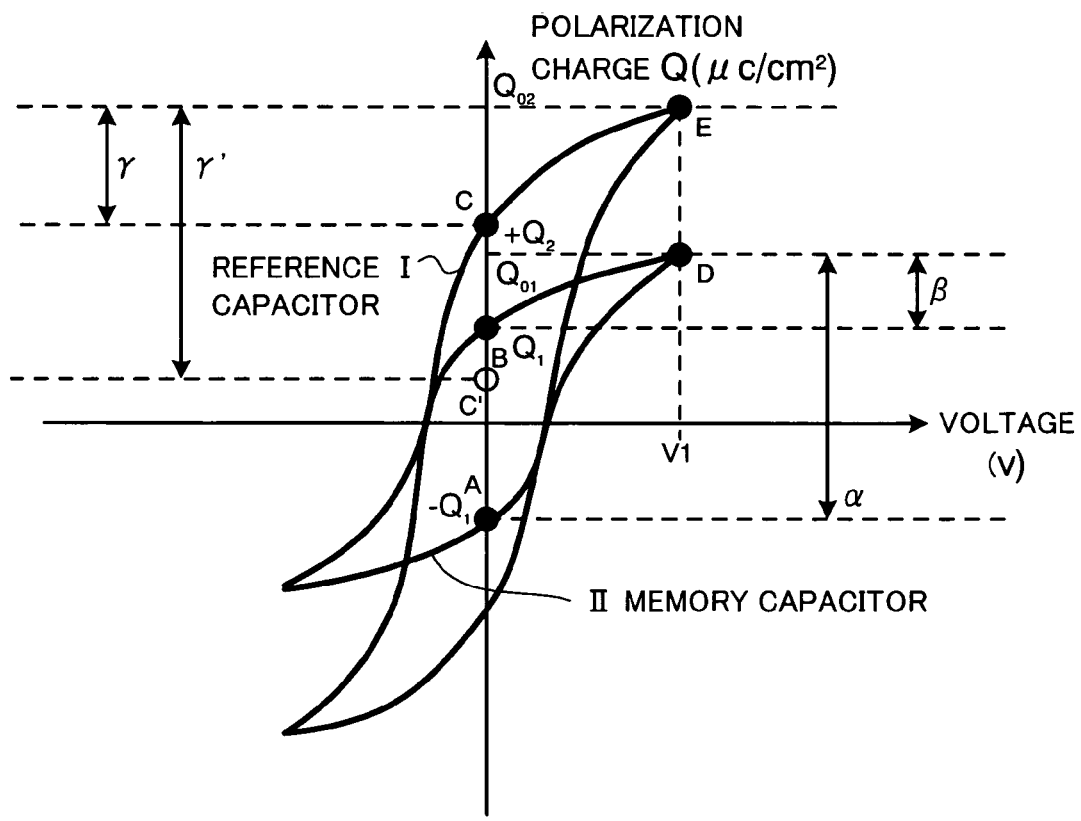
FIG. 2 is a view showing the relation between voltage and polarization charge quantity of a memory capacitor and a reference capacitor of the conventional ferroelectric non-volatile memory.
Figure 3:
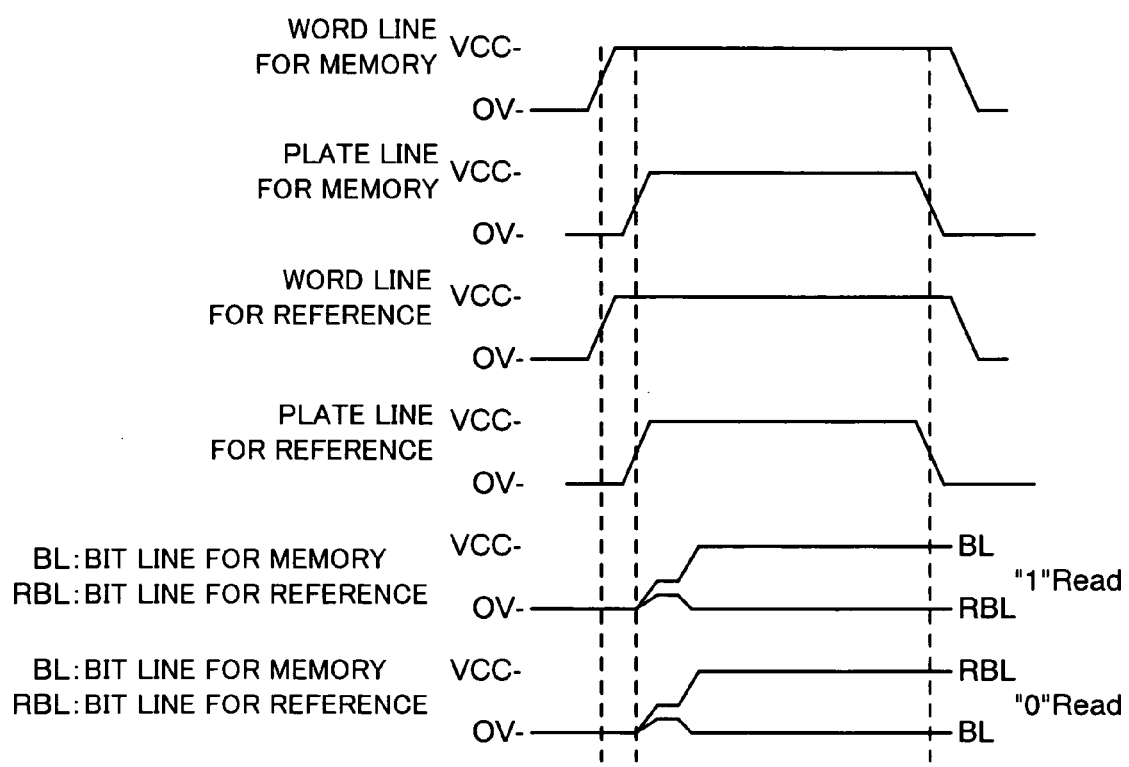
FIG. 3 is a timing chart of word lines, bit lines, and plate lines of the conventional ferroelectric non-volatile memory.

When writing "0" that becomes a reference value in the reference capacitor 16, the n-channel MOS transistor 29 is turned ON to make the potential of the plate line 18 for reference be Vcc, to make the potential of the word line 14 for reference be Vcc, and to make the potential of the bit line 20 for reference be 0. Thus, in the reference capacitor 16, the first electrode for the bit line 20 side becomes negative charge and the second electrode for the plate line 18 side becomes positive charge. As a result, voltage $V_1$ is applied to the reference capacitor 16 and the polarization charge quantity of the reference capacitor 16 becomes $Q_{02}$ as shown in FIG. 2. When the voltage of the word line 14 and the bit line 20 is returned to 0 thereafter, the residual polarization charge quantity of the reference capacitor 16 becomes $Q_2$.

Figure 9B:
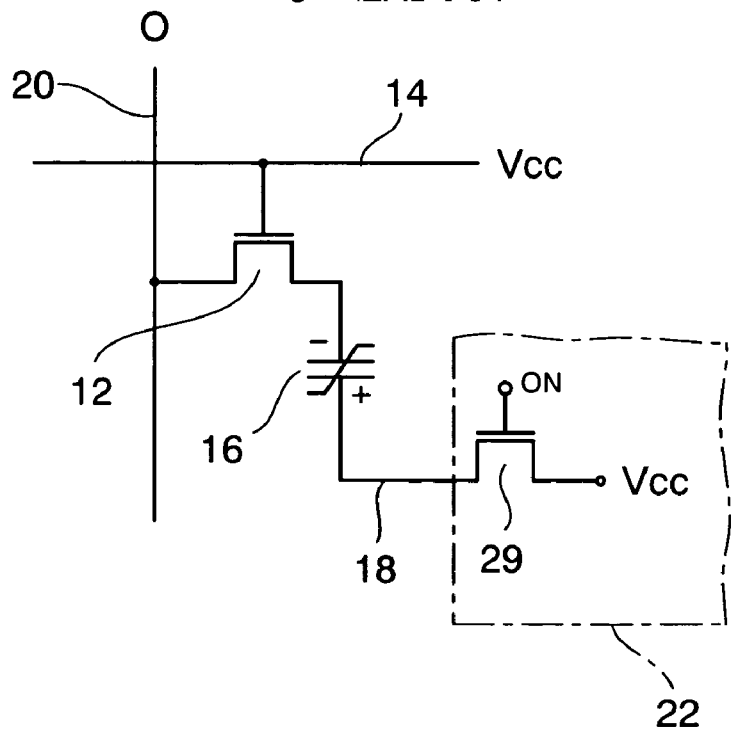

Further, in reading out data, the n-channel MOS transistor 29 is turned ON to make the voltage applied to the plate line 18 for reference be Vcc, to make the voltage applied to the bit line 20 for reference be 0, and to make the voltage of the word line 14 for reference be Vcc, as shown in FIG. 9B. Thus, the first electrode of the reference capacitor 16 for the bit line 20 side becomes negative charge and the second electrode thereof for the plate line 18 side becomes positive charge. With this, the polarization charge quantity moves from $Q_2$ to $Q_{02}$ by γ, as shown in FIG. 2.

When heat of 230° C. is applied for 1 minute, for example, to the semiconductor chip that is the ferroelectric non-volatile memory in order to perform mounting/IR heat treatment, the same heat is applied to the reference capacitor 16 having the residual polarization charge quantity $Q_2$. In this case, since electrons of the first electrode of the reference capacitor 16 readily pass through the n-channel MOS transistor for the bit line 20 side, the polarization charge quantity becomes as low as point C' of FIG. 2. Note that if the data is rewritten in the reference capacitor 16 after returning the temperature within an allowable range, the polarization charge quantity returns to point C.

Therefore, in the memory region where the data is written before the mounting/IR heat treatment, there is adopted a structure such that the n-channel MOS transistor 12 and the p-channel MOS transistor 25 are respectively connected to a positive direction and a negative direction of polarization of the reference capacitor 16 as shown in FIG. 5. It results in suppressing the reduction of the residual polarization charge quantity in the reference capacitor 16.

Note that the switching element, which is connected to the memory capacitors 11 via the plate lines 17 for memory in the plate driver 22 shown in FIG. 4, is the n-channel MOS transistor 29 as shown in FIG. 9A.

Figure 10A:
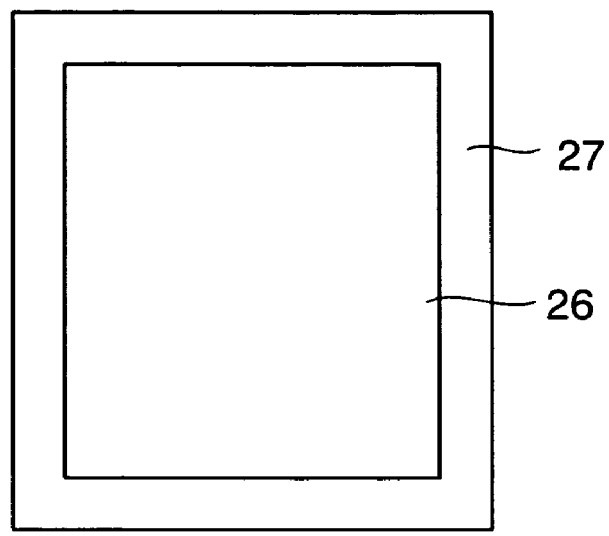
FIGS. 10A and 10B are plan views showing an area of a semiconductor chip of the ferroelectric non-volatile memory according to the first embodiment of the present invention.

Incidentally, in the memory cell 26 in the semiconductor chip as shown in FIG. 10A, the n-channel MOS transistors 12 and the p-channel MOS transistor 25, which are shown in FIG. 5, may be connected to all the reference capacitors 16 for reading out the data of the memory capacitors 15.

Figure 10B:
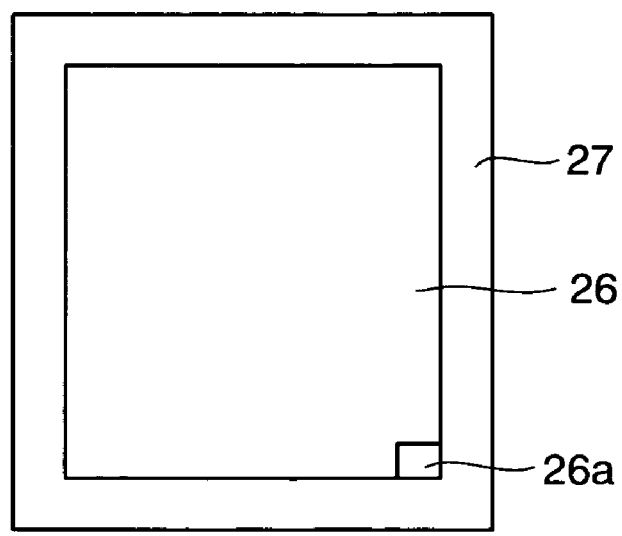

However, the p-channel MOS transistor is larger than the n-channel MOS transistor to improve characteristics. Therefore, in order to achieve further reduction of the chip area of memory, a control data region 26a is secured in a part of the memory region 26, the n-channel MOS transistor 12 and the p-channel MOS transistor 25 as shown in FIG. 5 are connected only to the reference capacitors 16 in the control data region 26a, and the n-channel MOS transistor 29 may be connected to the both ends of the reference capacitors 16 in other memory cell region 26 as shown in FIG. 9A. For example, by adopting a structure where the p-channel MOS transistors 25 are connected to the 1 or more reference capacitors 16 of 1% or less of a total number in FIG. 10B, the chip area is reduced by 5 to 10% comparing to FIG. 10A. It leads to manufacturing cost reduction.

Note that the periphery of the memory region 26 is a peripheral circuit region 27 where the plate driver 22, the column decoder 23, the row decoder 21, the sense amplifier 24 and the like are formed.

Second Embodiment

Figure 11:
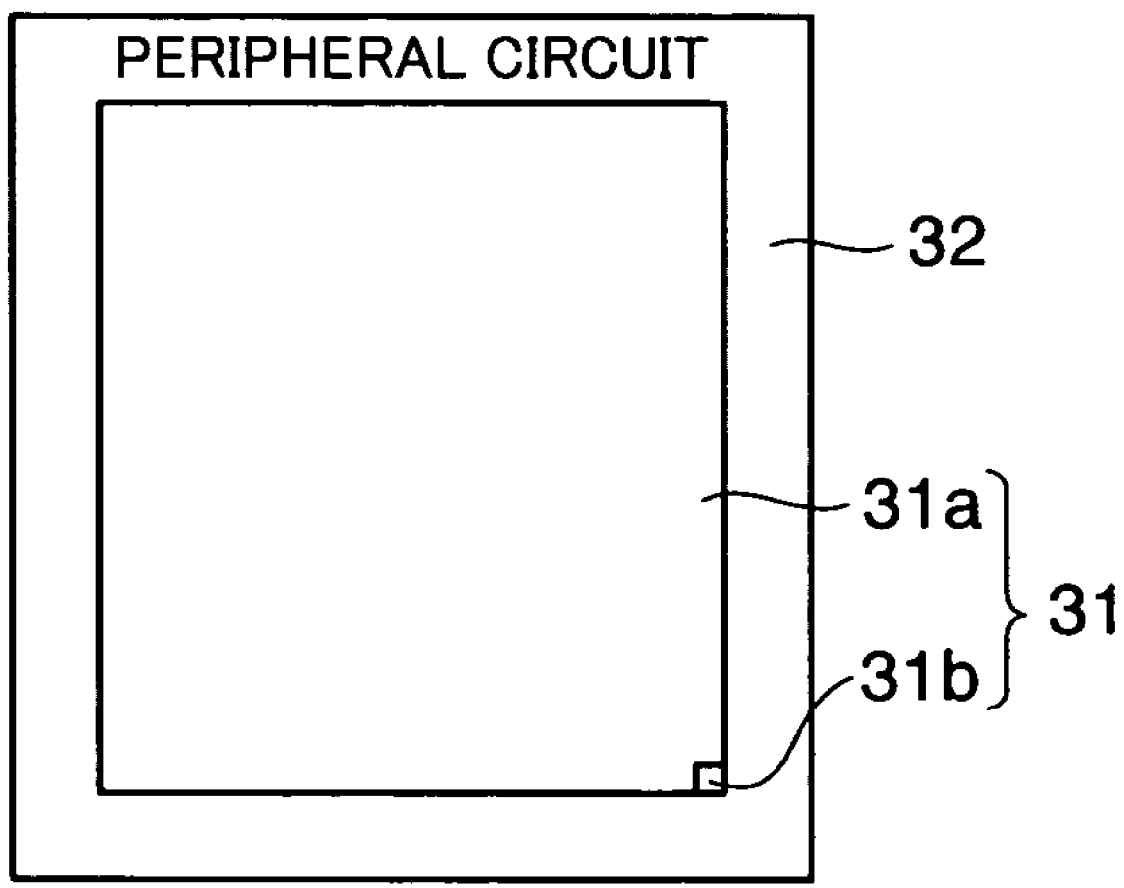
FIG. 11 is a plan view showing a section of a semiconductor chip having a ferroelectric non-volatile memory according to a second embodiment of the present invention.

FIG. 11 is the plan view showing a regional section of the semiconductor chip having the ferroelectric non-volatile memory according to the second embodiment of the present invention.

A memory cell region 31 as shown in FIG. 11 has a memory cell region 31a of 1T1C type and a memory cell region 31b of 2T2C type, and the memory cell region 31b of 2T2C type has a narrow area equivalent to a bit number of 1% or less of the memory cell region 31, for example. Further, the periphery of the memory cell region 31 is a peripheral circuit region 32.

Figure 12:
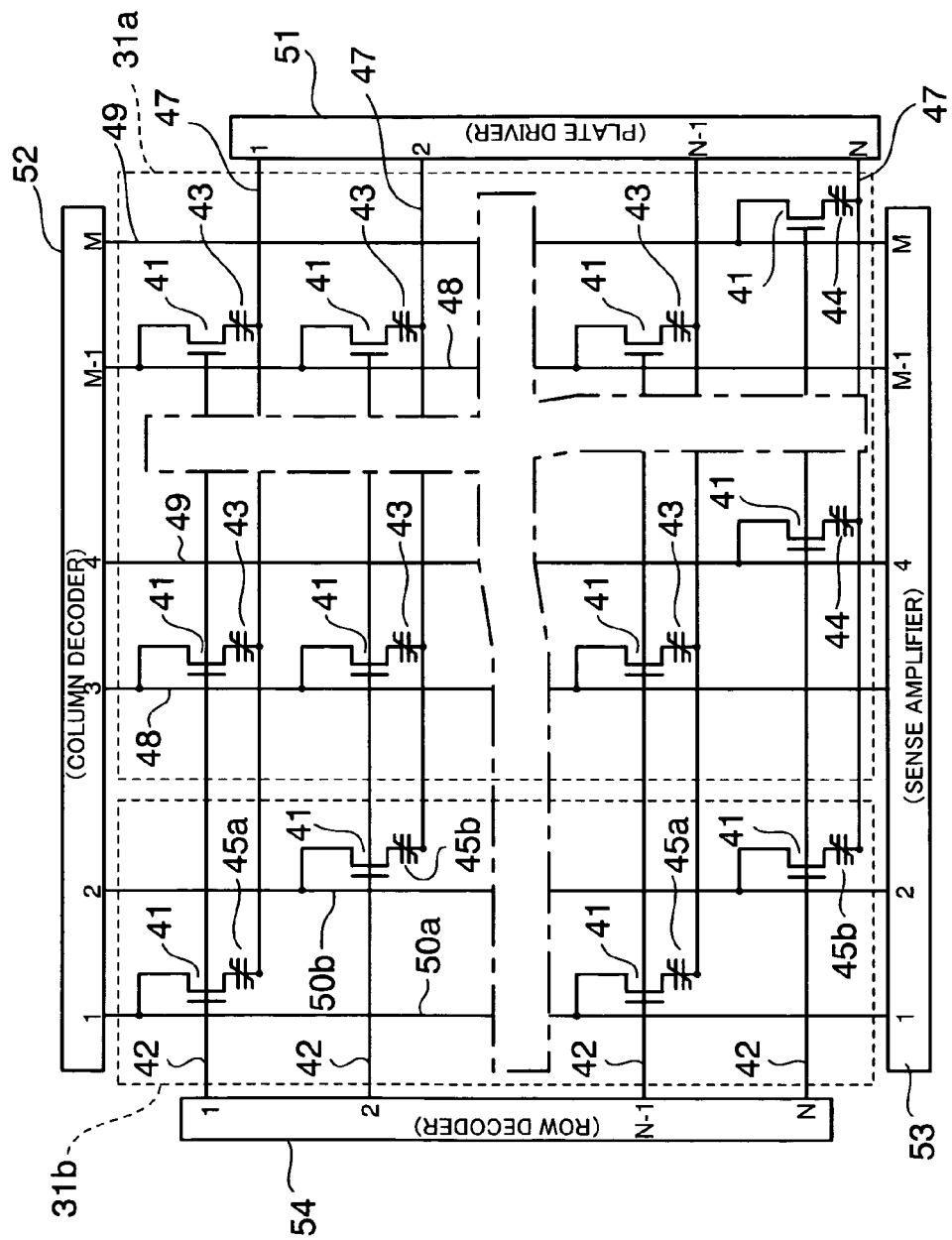
FIG. 12 is a circuit diagram of the ferroelectric non-volatile memory according to the second embodiment of the present invention.

FIG. 12 is the circuit diagram specifically showing the memory cell region 31a of 1T1C type, the memory cell region 31b of 2T2C type, and the peripheral circuit region 32.

In FIG. 12, N×M pieces (N,M:integer) of n-channel MOS transistors 41 are formed vertically and horizontally at an interval on a silicon substrate (not shown). Further, word lines 42 that connect the gate electrodes of the n-channel MOS transistors 41 by each row are formed in plural numbers at an interval on an element isolation insulating film (not shown) formed on the surface of the silicon substrate to partition the n-channel MOS transistors 41 from each other.

On a first insulating film (not shown) covering the n-channel MOS transistors 41, the ferroelectric capacitors are formed near the respective n-channel MOS transistors 41. The ferroelectric capacitor has a structure that the first electrode and the second electrode sandwich the ferroelectric film that is the PZT film, for example.

Among a plurality of the ferroelectric capacitors formed in the memory region 31a of 1T1C type, a plurality of the ferroelectric capacitors from the first row to (N−1)th row are memory capacitors 43, and a plurality of the ferroelectric capacitors on N-th row are reference capacitors 44. Further, regarding a plurality of the ferroelectric capacitors formed in the memory region 31b of 2T2C type, first and second memory capacitors 45a, 45b that store 1-bit by the two capacitors are formed in plural numbers.

The memory capacitors 43, 45a, 45b and the reference capacitors 44 are covered with a second insulating film (not shown).

In the memory region 31a of 1T1C type, bit lines 48 for memory and bit lines 49 for reference are formed alternately above the second insulating film at an interval so as to intersect the word lines 42. Further, in the memory region 31b of 2T2C type, a first bit line 50a and a second bit line 50b are formed alternately above the second insulating film at an interval so as to intersect the word lines 42, and reverse signals are applied to the first bit line 50a and the second bit line 50b, respectively.

Furthermore, the M lines of bit lines 48, 49, 50a, 50b are in solid intersection with N lines of word lines 42 into a lattice shape.

In the memory region 31a of 1T1C type, one of source/drains of the first to (N−1)th respective n-channel MOS transistors 41 arranged in the vertical direction is connected to each of a plurality of the bit lines 48 for memory. Further, the other one of source/drains of each a plurality of the n-channel MOS transistors 41 in each of the first to (N−1)th rows is connected to the first electrode of each the memory capacitors 43. Furthermore, the second electrodes of a plurality of the memory capacitors 43 of the first to (N−1)th rows are connected to a same plate line 47.

Moreover, in the memory region 31a of 1T1C type, the first electrode of reference capacitor 44 is connected to a bit line 49 for reference via source/drain of the n-channel MOS transistor 41. In addition, the second electrode of the reference capacitors 44 is connected to the N-th plate line 47. Regarding the plate line 47, a structure that it serves as the second electrode of each the memory capacitors 43 and the reference capacitors 44, or a structure that it is formed above the second insulating film covering the memory capacitors 43 and the reference capacitors 44.

In the memory cell region 31b of 2T2C type, one of source/drains of each the n-channel MOS transistors 41 on an odd-numbered position in the vertical direction is connected to the first bit line 50a, and one of source/drains of each the n-channel MOS transistors 41 on an even-numbered position in the vertical direction is connected to the second bit line 50b.

Further, in the vertical direction, the first memory capacitor 45a is connected between the other one of source/drains of each the n-channel MOS transistors 41 on the odd-numbered position and the plate line 47 on the same-numbered position, and the second memory capacitor 45b is connected between another node of source/drains of each the n-channel MOS transistor 41 on the even-numbered position and the plate line 47 on the same-numbered position.

Furthermore, in the peripheral circuit 32, the plate lines 47 are connected to a plate driver 51, one ends of the bit lines 48, 49, 50a, 50b are connected to a column decoder 52, the other ends of the bit lines 48, 49, 50a, 50b are connected to a sense amplifier 53 in the peripheral circuit region, and the word lines 42 are connected to a row decoder 54.

As described above, in each intersection region of a plurality of the bit lines 48 for memory and a plurality of the word lines 42 in the memory cell region 31a of 1T1C type, there is provided a structure such that source/drain of the n-channel MOS transistors 41 and the memory capacitor 43 are connected between the bit lines for memory 48 and the word lines 42. Further, in each the intersection regions of a plurality of the bit lines 49 for reference and one word line 42, there is provided a structure such that source/drains of the n-channel MOS transistor 41 and the reference capacitor 44 are connected between the bit line 49 for reference and the word line 42.

Still further, in each intersection region of the first bit line 50a and the word line 42 on the odd-numbered position in the memory cell region 31b of 2T2C type, there is provided a structure such that source/drains of the n-channel MOS transistor 41 and the first memory capacitor 45a are connected between the first bit line 50a and the word line 42. Further, in each intersection region of the second bit line 50b and the word line 42 on the even-numbered position, there is provided a structure such that source/drains of the n-channel MOS transistor 41 and the second memory capacitor 45b are connected between the second bit line 50b and the word line 42.

Note that elements such as the n-channel MOS transistors 41, the memory capacitors 43, 45a, 45b, the reference capacitors 44, the word lines 42, the bit lines 48, 49, 50a, 50b and plate lines 47 are connected to each other by direct connection or connection via conductive patterns, conductive plugs, holes, or the like.

In the above-described embodiment, the control data is written in the memory capacitors 45a, 45b in the memory cell region 31b of 2T2C type prior to the mounting/IR heat treatment of the semiconductor chip on which the ferroelectric non-volatile memory is formed. Then, data is written by a customer in the memory capacitors 43 in the memory cell region 31a of 1T1C type after the mounting/IR heat treatment.

In the memory cell region 31b of 2T2C type, a 1-bit memory cell is constituted by the first memory capacitor 45a which is connected to the first word line 42 and the first bit line 50a, and the second memory capacitor 45b which is connected to the second word line 42 and the second bit line 50b. In this case, the first memory capacitor 45a and the second memory capacitor 45b are in the residual polarization states that are opposite to each other.

Figure 13:
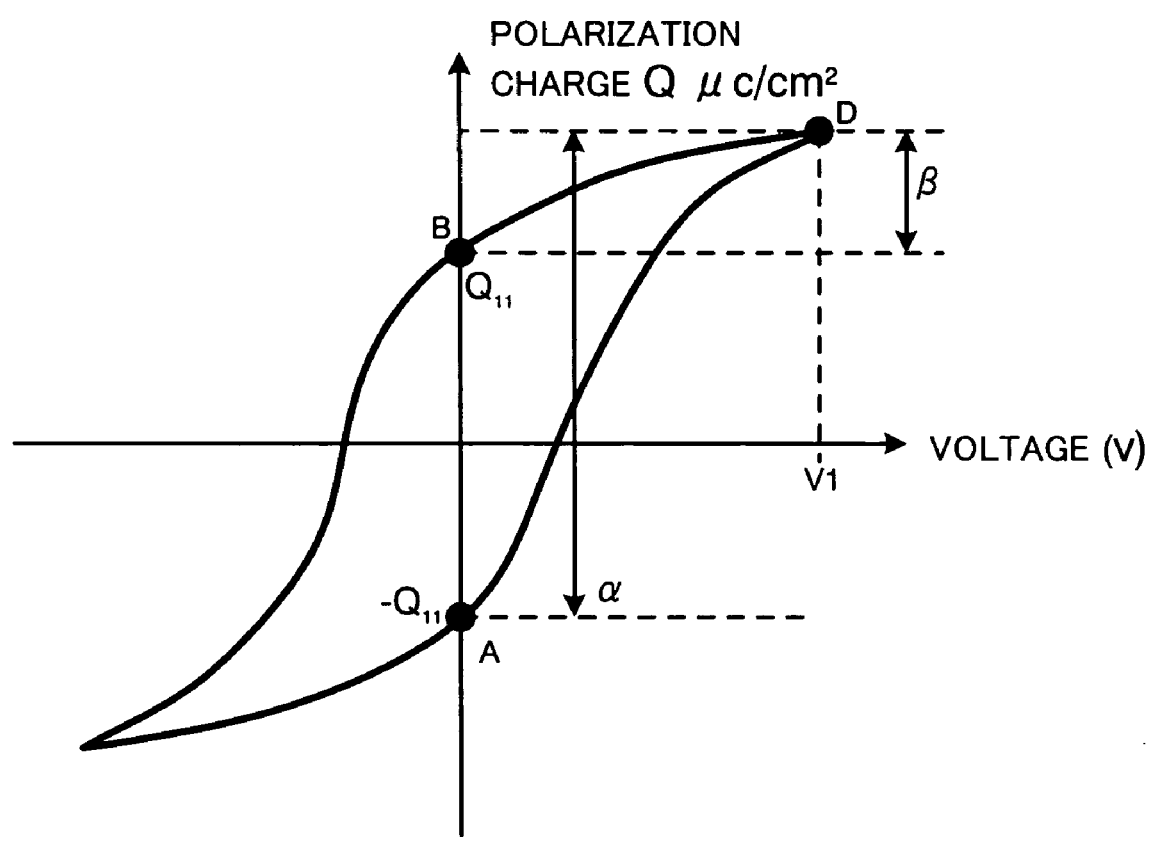
FIG. 13 is a view showing the relation between voltage and polarization charge quantity of a memory capacitor and a reference capacitor of the ferroelectric non-volatile memory according to the second embodiment of the present invention.

Herein, the first memory capacitor 45a and the second memory capacitor 45b have substantially the same hysteresis loop in the relation between the polarization charge and the voltage as shown in FIG. 13. For example, in FIG. 13, the first memory capacitor 45a has the residual polarization charge of $-Q_{11}$ at point A, and the second memory capacitor 45b has the residual polarization charge of $Q_{11}$ at point B, with which it is assumed that data "1" is written. Note that, in the state where data "0" is written, the first memory capacitor 45a has the residual polarization charge of $Q_{11}$ at point B, and the second memory capacitor 45b has the residual polarization charge of $-Q_{11}$ at point A.

Figure 14:
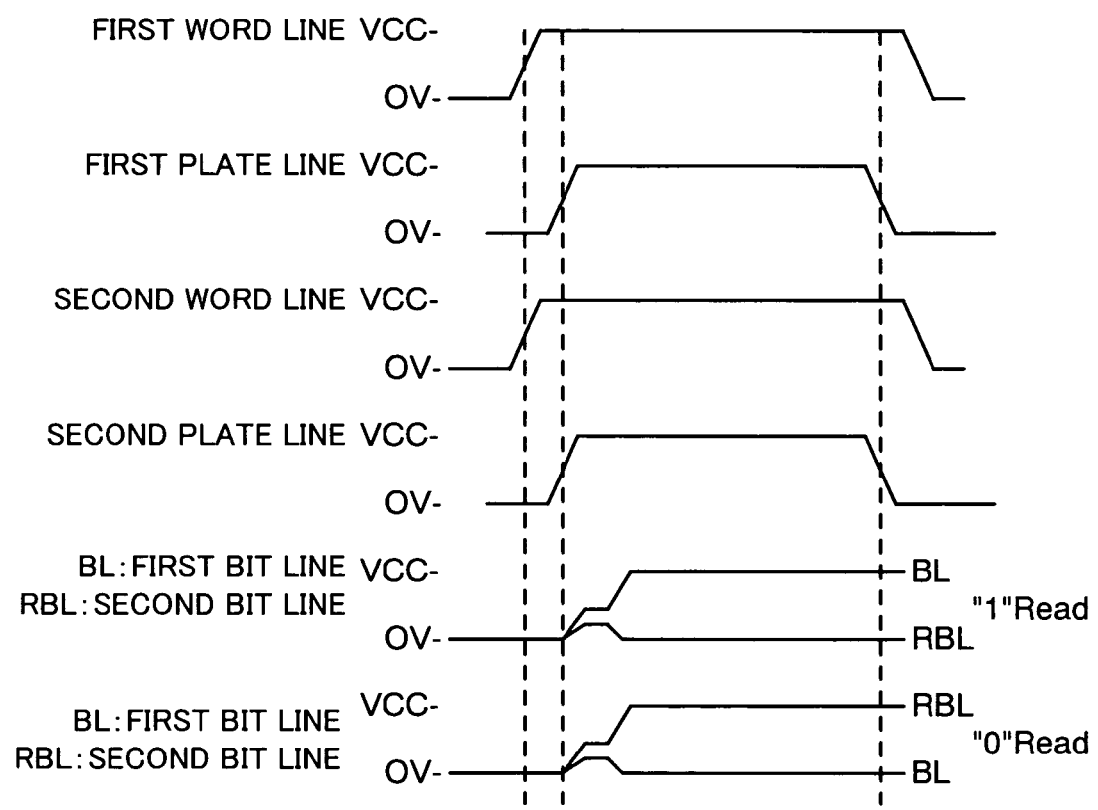
FIG. 14 is a timing chart of word lines, bit lines, and plate lines of the ferroelectric non-volatile memory according to the second embodiment of the present invention.

Then, a readout signal is applied according to the timing chart shown in FIG. 14 when reading out the data.

First, after the voltage that the row decoder 54 applies to adjacent first and second word lines 42 has risen from 0 to Vcc, the voltage of a signal applied to the first and second plate lines 47 rises from 0 to Vcc.

With the rising of the voltage of the first and second plate lines 47, the voltage $V_1$ is applied to the first memory capacitor 45a, whereby the polarization state of the first memory capacitor 45a moves from point A to point D along the hysteresis loop shown in FIG. 13. At the same time, the voltage $V_1$ is also applied to the second memory capacitor 45b, whereby the polarization state of the second memory capacitor 45b moves from point B to point D along the hysteresis loop shown in FIG. 13.

Assuming that the polarization charge quantity at point D is $Q_{12}$, the polarization transfer quantity of the first memory capacitor 45a becomes $\alpha = Q_{12} - (-Q_{11})$ and the polarization transfer quantity of the second memory capacitor 45b becomes $\beta = Q_{12} - Q_{11}$.

In this case, when data "1" is written in the memory cell for 1-bit, the polarization state of the first memory capacitor 45a is inverted, and the polarization state of the second memory capacitor 45b is not inverted. Note that when data "0" is written in the memory cell for 1-bit, the polarization state of the first memory capacitor 45a is not inverted, and the polarization state of the second memory capacitor 45b is inverted.

In other words, the transfer quantity of polarization of the first memory capacitor 45a whose polarization is inverted becomes $\alpha$, and the transfer quantity of polarization of the second memory capacitor 45b whose polarization is not inverted becomes $\beta$. Then the sense amplifier 53 detects the variation of potential caused by the size of the transfer quantity of polarization in the first and second bit lines 50a, 50b, holds as a fact that the charge transfer quantity from the first memory capacitor 45a is larger than the charge transfer quantity from the second memory capacitor 45b, and holds as a fact that the data "1" is stored in the memory cell of 1-bit.

On the contrary, when the amplifier holds as a fact that the charge transfer quantity from the second memory capacitor 45b is larger than the charge transfer quantity from the first memory capacitor 45a, further it holds as a fact that the data "0" is stored in the memory cell of 1-bit.

As described above, this embodiment adopts 2T2C type in the memory region in which data is written before the mounting/IR heat treatment, and thus the readout error does not occur even if a slight depolarization occurs in the memory capacitors.

Therefore, the sense amplifier 53 accurately reads out the data of memory cell based on the variation quantity of potential of the first and second bit lines 50a, 50b.

Furthermore, in the above-described memory cell region 31, when the number of bits in the memory cell region of 2T2C type 31b is set to 1% of the entire number of bits, the chip area can be reduced by 20 to 50% comparing to the structure where the entire memory cell region 31 is formed with 2T2C type, and the manufacturing cost can be reduced as well. Note that only 1-bit may be formed with 2T2C type.

What is claimed is:

1. A semiconductor device comprising:
   a plurality of ferroelectric capacitors for memory in which each one end thereof is connected to each of a plurality of first bit lines via switching transistor;
   first plate lines connected to the other ends of said ferroelectric capacitors for memory;
   first ferroelectric capacitors for reference in which each one end thereof is connected to a second bit line via first n-channel MOS transistor;
   a second plate line connected to the other ends of said first ferroelectric capacitors for reference; and
   a p-channel MOS transistor connected to said second plate line, wherein said p-channel MOS transistor is formed in a plate driver circuit to which said first plate lines and said second plate line are connected;
   wherein
   said plate driver circuit has a structure that the circuit applies voltage lower than that of said second bit line to said second plate line via said p-channel MOS transistor in an ON state of said p-channel MOS transistor.

2. A semiconductor device according to claim 1, wherein said switching transistor is n-channel MOS transistor.

3. A semiconductor device according to claim 1 further comprising:
   a sense amplifier that amplifies voltage variation quantity of said first bit lines and voltage variation quantity of said second bit line.

4. A semiconductor device comprising:
   a plurality of ferroelectric capacitors for memory in which each one end thereof is connected to each of a plurality of first bit lines via switching transistor;
   first plate lines connected to the other ends of said ferroelectric capacitors for memory;
   first ferroelectric capacitors for reference in which each one end thereof is connected to a second bit line via first n-channel MOS transistor;
   a second plate line connected to the other ends of said first ferroelectric capacitors for reference; and
   a p-channel MOS transistor connected to said second plate line;
   and further comprising:
   second ferroelectric capacitors for reference in which each one end thereof is connected to a third bit line via second n-channel MOS transistor;
   a third plate line connected to the other ends of said ferroelectric capacitors for reference; and
   a third n-channel MOS transistor connected to said third plate line.

5. A semiconductor device according to claim 4, wherein the number of said first ferroelectric capacitors for reference is 1% or less of a total number of said second ferroelectric capacitors for reference and said first ferroelectric capacitors for reference.

6. A semiconductor device comprising:
   a plurality of ferroelectric capacitors for memory in which each one end thereof is connected to each of a plurality of first bit lines via switching transistor;
   first plate lines connected to the other ends of said ferroelectric capacitors for memory;
   first ferroelectric capacitors for reference in which each one end thereof is connected to a second bit line via first n-channel MOS transistor;
   a second plate line connected to the other ends of said first ferroelectric capacitors for reference; and
   a p-channel MOS transistor connected to said second plate line;
   wherein said first ferroelectric capacitors are elements to which data having minus polarization charge is written before heat treatment.

7. A semiconductor device according to claim 6, wherein said heat treatment is performed at 200° C. or more.

8. A semiconductor device comprising:
   a memory cell region of 2T2C type, which stores 1-bit by first and second transistors and first and second ferroelectric capacitors for memory; and
   a memory cell region of 1T1C type, which stores 1-bit by a third transistor and a third ferroelectric capacitor for memory;
   wherein said memory cell region of 2T2C type is a region corresponding to a range having 1% or less of the number of said bits.

9. A semiconductor device comprising:
   a memory cell region of 2T2C type, which stores 1-bit by first and second transistors and first and second ferroelectric capacitors for memory; and
   a memory cell region of 1T1C type, which stores 1-bit by a third transistor and a third ferroelectric capacitor for memory;
   wherein said memory cell region of 2T2C type is a region to which data is written before heat treatment.

10. A semiconductor device according to claim 9, wherein said heat treatment is performed at 200° C. or more.

* * * * *